United States Patent
Zimmerman et al.

(10) Patent No.: US 9,091,712 B2
(45) Date of Patent: Jul. 28, 2015

(54) SHIELDING INTEGRITY TESTING FOR CABLE DROP

(75) Inventors: Dennis A. Zimmerman, Bridgewater, VA (US); Joseph R. Early, Harrisonburg, VA (US); Marc-Yvon Comeau, Massanutten, VA (US)

(73) Assignee: ComSonics, Inc., Harrisonburg, VA (US)

( * ) Notice: Subject to any disclaimer, the term of this patent is extended or adjusted under 35 U.S.C. 154(b) by 467 days.

(21) Appl. No.: 13/282,849

(22) Filed: Oct. 27, 2011

(65) Prior Publication Data
US 2013/0110466 A1    May 2, 2013

(51) Int. Cl.
H04B 15/00 (2006.01)
G01R 29/08 (2006.01)
H04B 17/10 (2015.01)
H04B 17/27 (2015.01)

(52) U.S. Cl.
CPC .......... *G01R 29/0835* (2013.01); *H04B 17/102* (2013.01); *H04B 17/27* (2013.01)

(58) Field of Classification Search
CPC ........... G01R 29/0835; H04B 17/0032; H04B 17/0072
USPC ....................... 702/76, 189; 455/456; 342/459
See application file for complete search history.

(56) References Cited

U.S. PATENT DOCUMENTS

| | | | | |
|---|---|---|---|---|
| 5,294,937 A * | 3/1994 | Ostteen et al. | | 342/459 |
| 5,777,662 A | 7/1998 | Zimmerman | | |
| 6,978,476 B2 * | 12/2005 | Zimmerman | | 725/125 |
| 7,873,322 B2 | 1/2011 | Flask et al. | | |
| 7,996,018 B1 * | 8/2011 | Fan | | 455/456.3 |
| 2002/0087295 A1 * | 7/2002 | Kim | | 703/2 |
| 2003/0040272 A1 * | 2/2003 | Lelievre et al. | | 455/3.06 |
| 2004/0009785 A1 * | 1/2004 | Nelson et al. | | 455/522 |
| 2009/0267615 A1 * | 10/2009 | Jones et al. | | 324/627 |
| 2011/0055632 A1 * | 3/2011 | Zimmerman | | 714/31 |
| 2012/0010836 A1 * | 1/2012 | Shemesh et al. | | 702/76 |

FOREIGN PATENT DOCUMENTS

EP         964514 A1 * 12/1999
WO   WO2013063187 A2 * 10/2012  ............. H04B 17/00

* cited by examiner

*Primary Examiner* — Tung S Lau
*Assistant Examiner* — Xiuquin Sun
(74) *Attorney, Agent, or Firm* — Whitham Curtis Christofferson & Cook, PC

(57) ABSTRACT

Signal ingress at an installations site forming a part of a broadband communication system is quantitatively evaluated for resistance to signal ingress using a computed ambient broadcast signal level based on a known location and effective radiated power of one or more transmitters. Anomalies due to signal path obstruction and/or multi-path reception are compensated by performing computations for a plurality of broadcast transmitters located in different directions from the installation site.

21 Claims, 3 Drawing Sheets

SHIELDING INTEGRITY TESTING FOR CABLE DROP

FIELD OF THE INVENTION

The present invention generally relates to subscriber installations of Broadband Communication Systems (BCS) and, more particularly, to testing and quantitative measurement of shielding integrity of subscriber installations against signal ingress.

BACKGROUND OF THE INVENTION

Broadband Communication Systems (BCSs), often referred to simply as cable systems, have been installed in many communities throughout the United States and elsewhere worldwide in recent years. The bandwidth available on such systems allows many sources of entertainment programming and information to be made available to large populations of people with few effects of interference and other problems often associated with over-the-air broadcasting. The BCS infrastructure is also available for returning signals from the installation site to a central location, so-called upstream signaling, for purposes such as internet access and telecommunications using voice over internet protocols (VoIP) and the like, including establishment of virtual private networks (VPNs).

BCSs operate over frequency bands which overlap with over-the-air/broadcast frequency bands, some of which serve important commercial and safety purposes such as aviation communications. Interference with such broadcast communications is, in theory and substantially in practice, avoided by confining the BCS signals within shielded cables. Therefore, BCS operators expend extraordinary efforts to maintain BCS systems to avoid signal egress and to detect and rapidly repair any shielding flaw or signal egress that may occur. Numerous sophisticated systems have been developed for such purposes as well as improving the efficiency with which such purposes may be accomplished.

A symmetrical effect to signal egress is signal ingress in which an ambient electromagnetic signal enters into the BCS cable through a shielding flaw or deficiency. The signal distribution portion of a BCS is usually designed and installed with great care to provide a highly robust system which is, nevertheless, subject to damage and degradation from ambient conditions such as weather. Since signal egress can be more-or-less easily detected and repairs performed, those repairs are effective to remedy sources of signal ingress into the distribution portion of the BCS, as well.

It has been the practice to use optical communications through optical fiber cable over ever larger portions of the BCS since optical communication media are generally less subject to damage and signal attenuation over their geographical extent and damaged portions of such fiber optic cables do not result in electromagnetic field signal egress or ingress. Nevertheless, shielded cable remains the medium of choice for terminal portions of the BCS and for connection of subscriber equipment such as modems and so-called set-top boxes to interface to subscriber equipment such as televisions, computers and other communication equipment.

While expenditures for good design of the signal distribution portion of a BCS are economically effective, the same is not true for subscriber installations. Rather, hardware such as cable, connectors, directional couplers, signal splitters, amplifiers and the like have been carefully designed and largely standardized such that adequate shielding within a subscriber site will generally be provided by their routine use and assembly at the subscriber site. Nevertheless, the BCS operator has no control over or even knowledge of other devices that may be present at a subscriber site that may be sources of potentially large electromagnetic signals within the bands of frequencies at which the BCS operates. Many potential sources of such noise such as electric motors in heating/cooling systems, refrigerators, dishwashers, fans and the like or even electric lighting and entertainment devices that are seldom thought of as radio frequency (RF) noise sources may be present and radiate substantial RF noise. Further, inadequate assembly by the subscriber of well-designed components that may be as simple as inadequate tightening of a connector or the use of readily available and inexpensive but low quality components may function as a shielding flaw allowing ambient RF noise or broadcast signal ingress into the BCS. Moreover such noise can accumulate for a plurality of subscriber installations along the BCS system and be summed by the BCS system itself until it may reach a level which compromises upstream signaling. Therefore, it is important to assure shielding integrity at the subscriber site. Unfortunately, arrangements for quantitatively measuring signal ingress at a subscriber site have only been capable of measuring noise levels above the intended signal levels on the BCS or have required additional expensive and cumbersome equipment for indirectly measuring effectiveness of shielding.

SUMMARY OF THE INVENTION

It is therefore an object of the present invention to provide an arrangement for measuring RF signal ingress and shielding effectiveness that can be incorporated at little additional expense or weight into current test equipment or provided as a lightweight and easily operated accessory for such test equipment that can quantitatively measure shielding effectiveness in a subscriber installation.

In order to accomplish these and other objects of the invention, a testing instrument for quantitatively measuring shielding integrity in a subscriber installation is provided comprising a tunable signal detector that can be tuned to a frequency of an over-the-air broadcast signal, a global positioning system receiver, and a programmed data processor to compute a signal power level of the over-the-air signal at a location of the testing instrument based on a location and effective radiated power of a transmitter of the over-the-air signal.

In accordance with another aspect of the invention, a method of measuring resistance to signal ingress in an installation site of a broadband communication system is provided including steps of detecting a received signal level of a signal in the installation site having a frequency which corresponds to a broadcast signal frequency while the installation site is disconnected from the broadband communication system, computing an over-the-air signal level at the broadcast frequency based on a distance from a broadcast transmitter and an effective radiated power of the transmitter, and comparing signal levels determined in the detecting and computing steps to determine a resistance to signal ingress in the installation site.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
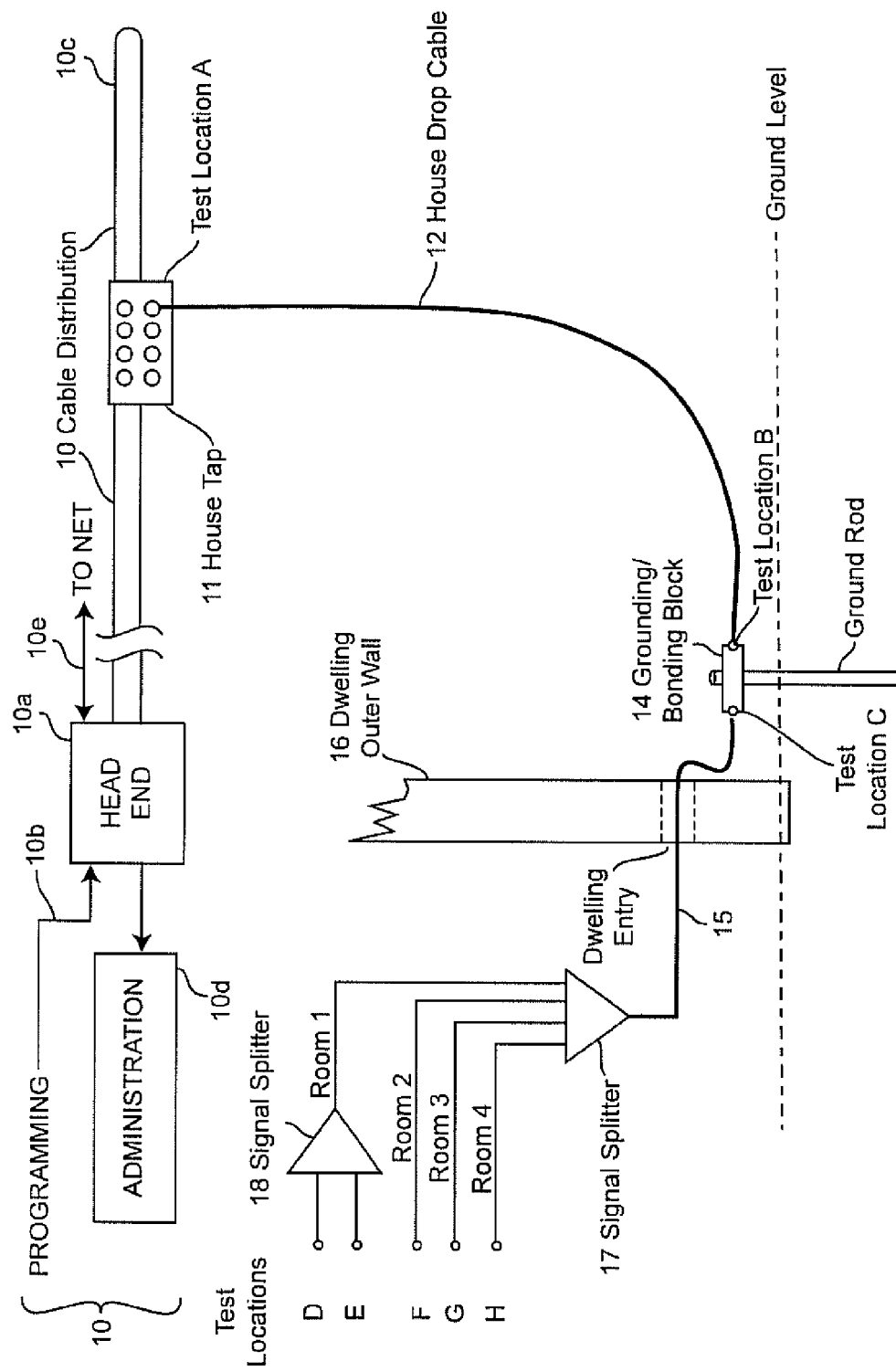
FIG. 1 is a schematic overview of the system in accordance with the invention.

Prior to discussing the invention in detail, prior known techniques for measuring signal ingress or resistance to signal ingress at a subscriber installation will be briefly summarized. It is believed that such a summary will facilitate an understanding of the invention and provide an appreciation for the meritorious effects produced thereby.

U.S. Pat. No. 5,777,662 to Zimmerman, assigned to the assignee of the present invention and hereby fully incorporated by reference, is directed to a system for testing shielding integrity and measuring resistance to signal ingress at a subscriber installation. For this purpose, a portable transmitter is provided to radiate an identifiable signal, preferably including global positioning system (GPS) coordinates of the transmitter, at a known (low) power level in the vicinity of the subscriber installation (or any other location within the geographic extent of the BCS) and to seek to detect a power level of that signal on the BCS system or at the cable drop or grounding location and with a detector looking toward the installation site. If the detected power level of the signal in the BCS was found to be greater than a predetermined level below the power level of the transmitted signal, shielding flaws would be evident and repaired or additional shielding provided that could be assumed to be similarly effective in regard to any other RF noise sources proximate to the subscriber installation.

However, in such a system, it is necessary to maintain a low limit on the power level of the transmitted signal to avoid interference with broadcast or other critical communication signals. Further, such a system requires additional, potentially expensive equipment comprising at least a portable transmitter to be carried to the installation site and operated by installation personnel; imposing further costs as well as inconvenience. Nevertheless, this system was highly effective for detecting shielding flaws in a BCS and could be used at any location throughout any BCS system, including a subscriber installation site.

U.S. Pat. No. 7,873,322 to Flask et al. is directed to a system for measurement of resistance of a subscriber installation to signal ingress. This system provided the advantage of eliminating the need for transmitting a signal that added noise to the environment by using the measured signal strength of broadcast FM band signals as a reference power level and detection of the power level of the same signal within the subscriber installation as an indirect measurement of the resistance of the shielding to signal ingress. However, even for such an indirect measurement, the measurement of the FM signal power level for use as a reference required the assembly and erecting of a dipole antenna of significant size, far larger than the antenna required for transmitting a signal of very limited power level, at the installation site.

While this system might seem capable of high accuracy due to actual measurement of power level of ambient signals at a given frequency at the installation site, it is less than fully effective to insure adequacy of shielding against signal ingress. First of all, a dipole antenna is directional and subject to errors of orientation in regard to a source of ambient broadcast signals while a shielding flaw (acting as a receiving antenna for ambient noise and/or signals) may or may not be directional and, in any event, a shielding flaw provides no opportunity for adjustment of orientation such as is available for a dipole antenna. An error in orientation of the dipole antenna would also cause the measured signal level to be measured as less than the actual ambient signal level. Further, the measurement of power level of either the ambient signal or the signal in the installation may be differently subject to multi-path reception which may alter apparent signal strength, as measured. Therefore, this methodology, while seemingly well-designed for good measurement of resistance to signal ingress of an installation site, may also provide misleading and/or anomalous results and lead to qualifying an installation which is actually subject to significant signal ingress or lead to loss of time searching for a shielding flaw or noise source that is not, in fact, significant (e.g. a "false positive"). Further, while this system avoids transmission of even a small signal in a potentially critical frequency band, it does not improve convenience for BCS personnel because it requires a receiving antenna of significant size to be erected and manipulated.

Referring now to the drawings, and more particularly to FIG. 1, there is schematically shown an exemplary broadband communication system (BCS) and cable drop installation to which the invention is applicable. It should be understood that FIG. 1 is arranged to facilitate an understanding of the application of the invention, and no portion thereof is admitted to be prior art in regard to the present invention. It is also to be understood that while the invention will be described in connection with a Broadband Communications System (sometimes, for convenience, referred to hereinafter simply as a cable distribution system or cable system) in which the invention is particularly advantageous, the invention is also applicable to other types of magnetically shielded distributed systems such as dedicated communication or data processing systems or networks and the like.

In FIG. 1, an exemplary portion of a cable distribution system 10 comprising headend 10a, programming input 10b, distribution cable 10c, an administration portion 10d and an output system 10e for connecting upstream signaling to other communication infrastructure is shown. Headend 10a receives programming input for distribution, and provides suitable encoding and modulation of the programming information signal to be distributed over cable 10c. Headend 10a also receives upstream signaling from subscribers, appropriately demodulates and decodes it and outputs the information to a network such as the Internet or wired or wireless communication links as collectively indicated at 10e. Components 10a-10e are sometimes collectively referred to as the cable plant of a BCS.

Cable 10c is illustrated with a tap 11 attached thereto to deliver the signal carried by the cable distribution system to a subscriber installation such as a residence, business facility and the like and/or to connect upstream communications such as internet access and telephone service over house drop cable 12 (so-called since many installations are in residences but no inference in regard to the principal use of an installation site, whether or not within a building, should be made from such a term). In general, it is desirable and often required by local codes that the installation be grounded to prevent incursion of electrical discharges from the environment such as lightning and a grounding or bonding block 14 or the like is illustrated for performing such a function. An entry cable 15 then carries the signal through any structure (e.g. wall 16) which may be found at the installation site to one or more signal splitters and/or amplifiers 17, 18, to provide the signal to different locations at the installation site as may be required or desired.

Further signal splitters and/or amplifiers 17, 18 may be provided as may be required for a particular installation. The plurality of branches thus provided, if needed, are then terminated at so-called set-top-boxes (STBs) capable of receiving and decoding the distributed signal and/or interfacing an upstream signal to the cable system or, possibly, high-speed cable modems for bidirectional communications such as Internet access and/or telephony. Junctions between some of these structures are useful as test points to isolate such structures to determine defects and to conduct other desired tests.

For example, test point A will provide an indication of signal quality in the cable distribution system 10 as delivered by tap 11. Disconnecting house drop 12 from test point A and connecting a test instrument to the open end of house drop 12 provides test point A' which allows the determination of any noise that would be coupled to the installation from the environment of the installation site (signal ingress) which could be propagated upstream and into the cable distribution system 10. Disconnecting house drop 12 from test location B and connecting an instrument thereto (looking into the installation) allows the determination of results similar to those that would be obtained at test location A' but without the influence of the shielding resistance of the house drop 12. However, comparative testing at test points A' and B could isolate a shielding flaw or noise source affecting house drop 12. Test point C, with entry cable 15 disconnected, allows testing quality of the distribution cable signals including the influence of house drop cable 12 and connections upstream thereof. Test points D-H allow testing for defects or degraded signal propagation over entry cable 15 and signal splitters/amplifiers 17 and 18 as well as signal ingress into the connecting cables which can usually be individually traced efficiently if a problem is encountered.

During installation and/or problem diagnosis, a test instrument may be connected to each of these test points, in order and in either or both upstream and downstream directions, to trace signal propagation and maintenance of signal quality or, using the invention where the instrument is connected to the installation or portion thereof rather than to the cable distribution system, to determine a level of any signal ingress in the portion of the installation to which the test instrument is connected. Using prior known test instruments, the instrument would be connected to a test point with or without disconnection of downstream portions of the system, a test sequence initiated from the keyboard or other input arrangement of the test instrument, measurements made in accordance with programmed procedures stored in the test instrument (some procedures possibly being specific to a test point or a combination thereof) and the results displayed to an operator of the test instrument who would then be capable of evaluating them, diagnosing any abnormality and taking any required remedial action. Such tests can verify the quality of signal at each test point and termination of a cable branch within the installation site for normal testing or, in accordance with the present invention connecting the test instrument to look into the installation with the installation disconnected from the distribution cable.

In qualifying an initial installation or diagnosing some potential problems, the technician would routinely examine the spectrum of the signal at a test point for noise signals representing signal ingress at particular frequencies or ranges of frequencies. The location of any significant noise level found at test point A' or B can then be isolated by systematically disconnecting other test points D-H to determine the branch or branches delivering the ingress noise to the test point A' or B to identify the shielding flaw or the noise source and/or correct or improve shielding in the region where the noise ingress is found to occur. Conversely, if the detected level of signal ingress is below the established limit for qualification of an installation when the test is performed at point A' or B, no further testing or searching for shielding flaws (e.g. at test points D-H) need be done in the installation.

Thus it is seen that in essence, the testing procedure in accordance with the invention involves a systematic isolation of the sources of noise that are found at any given point in a subscriber installation beginning with the house drop 12, with the goal of assuring that the subscriber installation does not contribute to signal ingress (or egress) due to sources of ingress noise and/or shielding flaws (e.g. that act as a receiving antenna for ingress noise) within the installation. As discussed above, the measurements necessary to determine resistance to signal ingress of a subscriber installation requires a reference signal of known signal power to be present at the location of the installation. That is, the noise resulting from signal ingress in the system can be measured at any point in the system and some degree of noise is generally tolerable while some sources of noise may not be easily controlled but the actual resistance to signal ingress provided by a given quality of shielding cannot be quantitatively evaluated without a reference electromagnetic signal in the vicinity of the installation. As alluded to above, known systems have either provided a locally radiated small signal (the existence of which is in theory, undesirable as adding electromagnetic power into the environment which can potentially interfere with broadcast or other over-the-air communications, similar to the radiation of signal egress) or measured ambient RF signal power levels at the location which can lead to unreliable and misleading results while requiring substantial inconvenience to the making of the measurements.

The inventors have discovered that these problems of known systems for quantitatively evaluating ingress resistance can be alleviated by computing rather than measuring the signal power of ambient RF signals. It should be noted that while frequencies of broadcast FM signals are within the band of frequencies utilized by a BCS, the degree of ingress of signals at those respective frequencies are very similar to ingress of signals in the remainder of the BCS frequency band or spectrum. Transmitted RF signals outside but close to the BCS frequency band may also be used as long as the effective radiated power and transmitter location are known.

Use of a computed broadcast signal power level is considered much preferable to measuring the power level at a subscriber installation site since it requires no additional equipment other than a source of GPS location information and a processor, which are generally included in currently available test instruments or provided as highly portable stand-alone devices, as contrasted with a dipole antenna or assembly and operation of such an antenna which can, itself, be a source of measurement error. Use of computed broadcast power also eliminates or can compensate for numerous other sources of error in the measurement of the power level. Moreover, different locations within the extent of the installation site where FM signal strength could be measured may be differently affected by multi-path effects which can be largely and sufficiently compensated as will be discussed below.

Further, the purpose of quantitative measurement of resistance to signal ingress is to guarantee that the measured power level of an ingress signal in the subscriber installation is a certain specified level below the power level of that signal outside the system. Therefore, if the measured ingress power level is below the computed power level of a broadcast signal by the specified amount, it will guarantee that the resistance to ingress equals or exceeds the specification. Any transmission path that would tend to decrease the actual power level below the computed power level can be detected by tuning the signal detector (e.g. spectrum analyzer or signal level meter) to another FM signal from another FM station having a known effective radiated power and known location and repeating the relatively simple computation as will be described below and which can be performed automatically and repeated at other frequencies for verification with far less effort and potential for error than use of an antenna for ambient signal power level measurement.

As will be further detailed below, in accordance with a preferred mode of operation of the invention, the signals from the two strongest stations in each directional quadrant from the installation site or location within the installation site would be used and the respective ingress signal measurements for respective stations used to normalize the results to account for anomalies due to different multi-path effects and/or signal path obstruction. It is also preferred to retain the worst case ingress signal measurements to avoid a false positive. The smallest difference or "delta" between the computed signal strength and ingress signal power will indicate the worst shielding integrity at the installation site (e.g. dwelling). Additionally, a further path loss factor can be added to account for additional RF signal loss due to shielding by the structure in which the installation is made.

Figure 2:
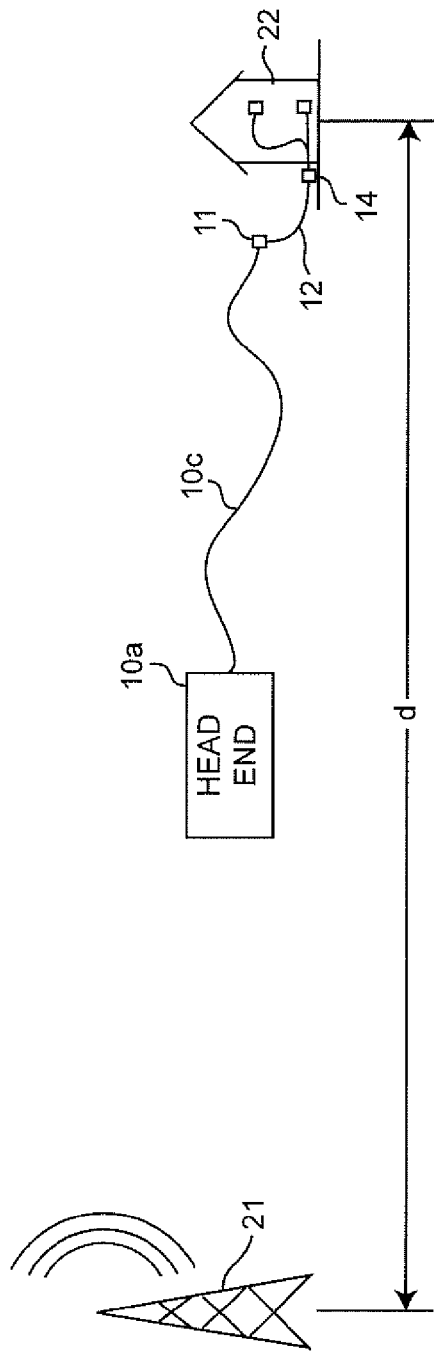
FIG. 2 is a diagram useful for understanding the basic principles and operation of the invention.

Referring now to FIG. 2, the basic principles of operation of the invention will now be explained. Assuming a RF broadcast (e.g. FM) transmitter 21 is transmitting with an effective radiated power of 50,000 watts or 77 dBm or 126 dBmV. The free space loss (FSL) or path loss over an unobstructed distance d can be computed in a well-known and straightforward manner. Specifically:

$$\text{Path loss} = (4\pi \times d/\lambda)^2$$
$$\text{Path Loss (dB)} = 10\log(4\pi \times d/\lambda)^2$$
$$= 20\log(4\pi \times d/\lambda)$$

If d=10 miles and the frequency of RF transmission is 108 MHZ (from which $\lambda$ can be computed), the free space loss can be computed to be approximately 96 dB. Therefore, the power level of that signal at the installation site will be equal to the transmitted power, less the free space loss, in this case −19 dBm which converts to 28 dBmV and can be used for a reference ambient signal power level for signal ingress measurements.

Figure 3:
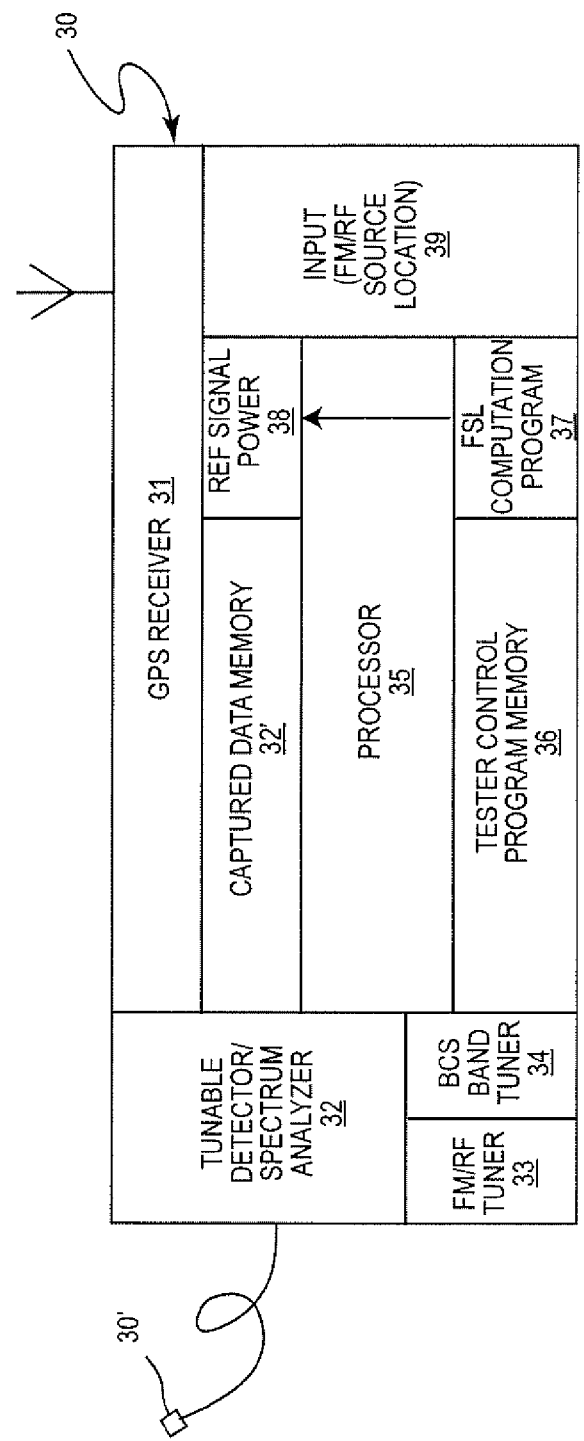
FIG. 3 is a schematic diagram of a test instrument in accordance with the invention.

In practice, test instruments 30 which are preferred for servicing BCSs contain or otherwise include provision for connection to GPS receivers 31 to correlate position of the instruments when an egress signal is received as shown in FIG. 3 in addition to an input connector 30' for connection to a test point of the BCS or, for practice of the present invention, a test point of the installation site such as test point A' or B, as described above, a tunable signal detector 32 such as a spectrum analyzer or signal level meter, a BCS band tuner 34 for controlling the spectrum analyzer or signal level meter, preferably under control of a programmed data processor, a memory 32' for storing captured test data, a processor 35 for controlling the tests and capturing data in accordance with programs stored in memory 36 and an input device (e.g. 39) such as a keyboard, voice command arrangement or the like. Such instruments generally remain activated as they are transported from one work site to another for detection of shielding flaws in the cable distribution system by detection of BCS signal egress. Therefore, the location of the instrument is always known to the instrument. The location and effective radiated power (ERP) of a transmitter 21 having good signal power level at an installation site is also known (e.g. from FCC records) and the location of one or more such transmitters that can be discriminated by transmission frequency can be loaded into the memory of the instrument from input 39. Generally, only a very few such RF transmitters will suffice for a BCS covering a very wide geographic area. It is preferred to use two transmitters per quadrant (e.g. 90° of heading or bearing) around the installation site or a total of eight transmitters, if available. It will often be the case that the same eight transmitters will suffice for the entire geographic area of a BCS since the preference for two transmitters per quadrant is not critical but, rather, a convenient and preferred criterion which will support compensation for signal path obstruction and multi-path effects even when the criterion is only approached by the physical circumstances of an installation site.

Test instruments in current use also generally include data processors 35 having significant processing power for conducting tests and capturing and formatting data for display and storage. Processor 35 is also generally supplied with ample program storage 36 for storing potentially complex test programs; a small portion of which can be allocated to the small program 37 required for computing signal power at a given location resulting from broadcast of a given effective radiated power from a given location. Therefore, computation of distance d of any subscriber installation site from a given RF transmitter (based on the GPS data reported for the installation site and the known location of each transmitter) and the power level expected for a given effective radiated power (ERP), transmission frequency and distance, d, can be computed with minimal processing overhead that can be considered negligible since these computations need only be performed once for each transmitter used for measurements at a given subscriber installation site.

The results of the computation can be stored in a small portion 38 of the memory 32' otherwise used for captured test data. This information is then available for comparison with other measurements made by the testing instrument, including measurements of ingress noise when the spectrum analyzer or signal level meter is tuned to the frequency of a suitably strong broadcast FM/RF frequency under control of FM/RF tuner 33.

Figure 4:
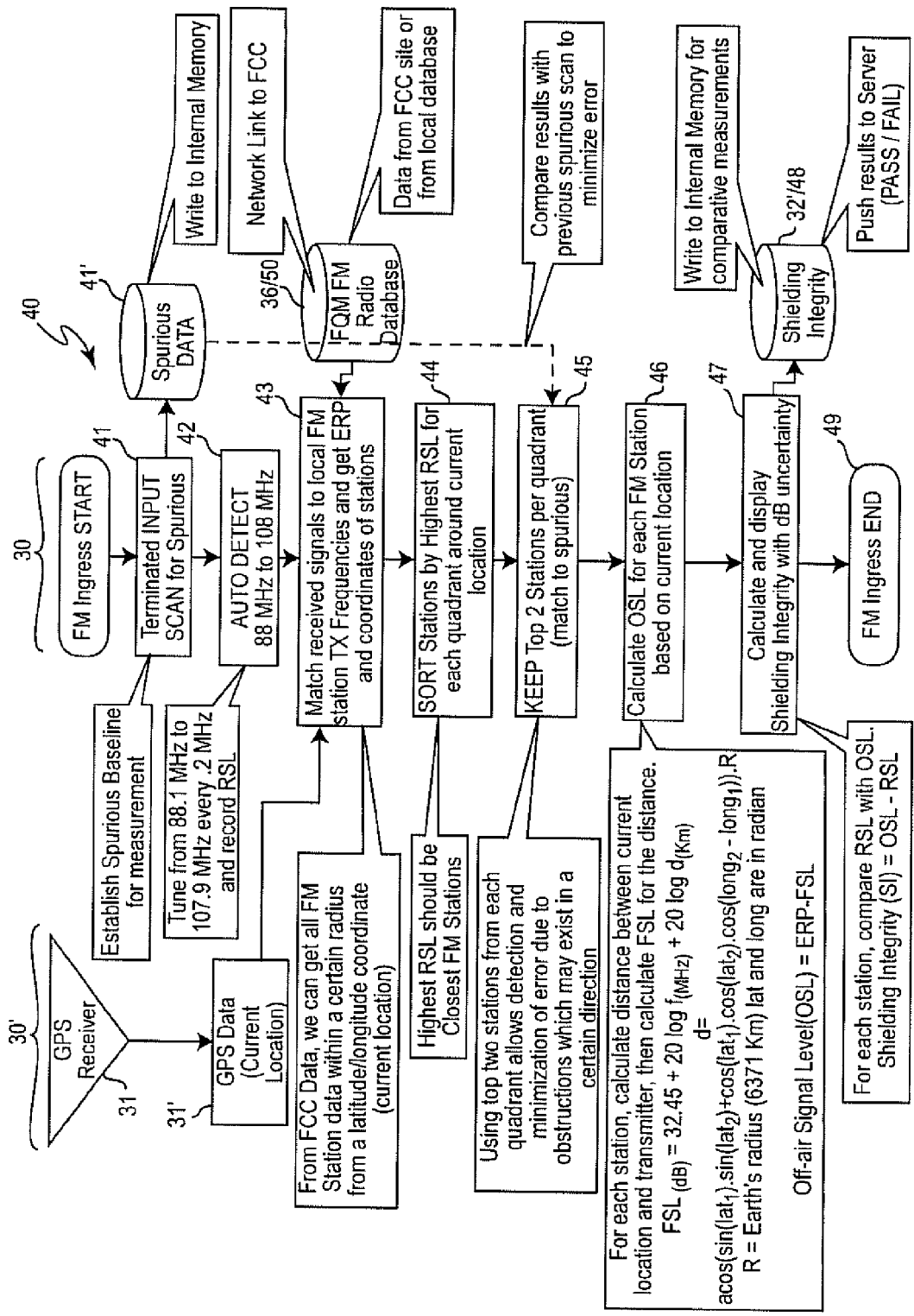
FIG. 4 is a flow chart illustrating preferred operation of the invention.

Referring now to FIG. 4, a preferred method of application of the invention to quantitatively evaluate resistance to signal ingress of a particular installation will now be discussed. It should be understood, however, that the invention can be successfully practiced while omitting several of the steps which will be described. Inclusion of such optional steps in the preferred application of the invention contributes to reliability and confidence in the measurements made while the optional steps may be automated and performed not only very quickly but entirely transparently to BCS personnel. It should also be noted that the basic procedure illustrated is a single linear sequence of operations that may be performed by a test instrument 30 with only an additional input of GPS location information for the installation site that may be provided from a GPS receiver either included in or external to the testing device 30 and which is generally indicated by reference numeral 31'.

The preferred method of use begins with the optional performance of a terminated input scan 41 for spurious signals at all frequencies within the FM band of frequencies and, as alluded to above, is performed with the installation disconnected and with the test instrument (e.g. spectrum analyzer or signal strength meter) input terminated into its characteristic impedance such that the test instrument and its connection can be assumed not to pick up external ambient signals. This procedure measures the noise in particular frequency bands within the test instrument and establishes a baseline or noise floor for spurious noise within the test instrument. These spurious noise levels are then preferably stored as illustrated at 41' for later evaluation.

Terminated input scan 41 is regarded as optional since the noise level within high quality current commercially available test instruments is very low and, at the current state of the art, such high-quality test instruments reliably meet internal noise specifications well in excess of the low levels necessary for successful practice of the invention to achieve and document adequately high resistance to signal ingress for BCSs. On the other hand, this terminated input scan may be important to assure that older test instruments have sufficiently low internal noise to avoid "false positive" detection of ingress signals at suitably low levels or to assure that the test instrument is performing within its design specifications. Therefore, while the terminated input scan is considered optional, obsolescent in many cases and seldom productive of useful information, it is still preferred since it can be performed automatically, quickly and transparently to BCS personnel while providing enhanced confidence in other measurements made and since it is important to completeness of documentation of an installation.

After the optional terminated input scan measurement 41 (if performed) is made, the test instrument 30 is then connected to the subscriber installation (while disconnected from the cable plant or distribution cable) for an automatic scan portion 42 of the test procedure. The automatic scan process 42 begins with tuning the test instrument 30 preferably to FM frequencies, in sequence, from 88.1 MHZ to 107.9 MHZ with 0.2 MHZ intervals between frequencies to which the test instrument is tuned. These frequencies correspond to possible frequency assignments for broadcast FM stations. Some frequencies can be omitted if no FM broadcast transmitters of sufficient power at particular frequencies are present and/or sufficiently proximate to the installation site or of sufficient effective radiated power to be considered. Then, as shown at step 43, if potential ingress signals are detected at any of the frequencies to which the test instrument has been tuned in step 42, those frequencies are matched to local FM broadcast stations for which locations and ERP information has been previously stored in memory 36 of the test instrument. Of course, if the test instrument has facilities for functioning as a communication device or communicating through such a device, such information can be located and downloaded from an external memory 50 such as FCC data for FM broadcast stations within a given radius of the GPS location; the external memory being accessed, for example, through the Internet, as needed.

The matches of ingress signals to local FM stations are then sorted in step 44 by received signal strength (RSL) for each quadrant around the installation site as illustrated at step 44. The stations with the highest RSL should usually be the stations located closest to the installation site and/or those emitting the highest ERP. It should be appreciated that the orientation of the quadrants is not important to the successful practice of the invention and it will generally be possible to define the respective orientations of the quadrants such that at least two stations will appear in each quadrant. Based on the sorting by RSL, the two identified FM broadcast stations in each quadrant are retained for evaluation of measurements and other FM broadcast stations of lesser RSL can be omitted from further processing and thus data corresponding to them need not be retained. The FM broadcast stations having the highest RSL in each quadrant are then, optionally, matched against the spurious signals stored in memory 41' in the course of step 41, described above, as illustrated at step 45 which is also regarded as optional and cannot be performed if optional step 41 is not preformed. Any such stations broadcasting at a frequency similar to a frequency of spurious noise in the test instrument 30 may be disregarded as likely to produce "false positive" or otherwise anomalous measurement results unless the FM signal level received exceeds the spurious signal component of the instrument by more than 6 dB. Alternative FM broadcast stations in the same quadrant and of sufficient received signal level could be substituted, if desired. (Although possible, it is not considered to be desirable to compensate the measurement made in accordance with the spurious noise level found in the test instrument in step 41.) However, it should be understood, as noted above, the number of FM broadcast stations in each quadrant is not critical to the successful practice of the invention since adequate measurements can be carried out with fewer FM broadcast stations identified per quadrant and with less than all quadrants having any identified FM broadcast station therein. In fact, use of more than a single FM broadcast station and use of stations in widely differing directions from the installation site is only important to compensation for possible signal path obstructions and multi-path effects that may be encountered at the installation site and thus serves to increase confidence in the measurements made as well as providing a quantitative evaluation (in dB) of the uncertainty included in the measurement.

For each retained FM broadcast station, the over-the-air signal level (OSL, sometimes referred to as the off-air signal level) at the installation location is computed as the ERP less the free space loss (FSL) as discussed above and illustrated at step 46. Then, as illustrated at step 47, the measured ingress RSL is compared to the OSL to yield a shielding integrity figure of merit, SI=OSL−RSL and an indication of measurement uncertainty (in dB) based on differences in shielding integrity (SI) at the respective FM broadcast station transmission frequencies for which the calculation is performed. These results are then stored in internal or external memory 32'/48 for comparative measurements and evaluated to make a pass/fail determination of resistance of the installation to signal ingress which is duly documented in the normal course of qualifying the installation. Following the above procedure, once any shielding flaws or other sources of ingress noise, if any, are isolated and remedied and reduction of ingress below specified levels is achieved, as confirmed by repetition of the process of FIG. 4, the house drop 12 is reconnected for normal operation of the installation.

To properly appreciate the effectiveness of the invention to make the required measurements while providing greatly increased convenience of use, consider that the minimum measurable signal level is −60 dBmV. Therefore the maximum measurable shielding integrity is the power level of off-air signals at the installation site less the minimum measurable power level. In the case of the above example, the range of measurable maximum shielding integrity would be $$28\ dBmV - (-60\ dB) = 88\ dB.$$

That is, the stronger the ambient OSL, the larger the resistance to signal ingress that can be measured and which can be significantly greater than the dynamic range otherwise limited by the minimum measurable signal level.

In view of the foregoing, it is seen that the invention provides for measurement of shielding integrity and resistance to signal ingress at a subscriber installation that is far more convenient and simple and with the potential for verification of results in a simple and automated manner than has been available prior to the present invention. The invention requires only the addition of a source of GPS position information if none is provided within the test instrument. Otherwise the invention can be implemented in testing instruments of current design simply by storage of a program for performing a very simple calculation.

While the invention has been described in terms of a single preferred embodiment, those skilled in the art will recognize that the invention can be practiced with modification within the spirit and scope of the appended claims.

The invention claimed is:

1. A testing instrument for quantitatively determining a measurement of shielding integrity against signal ingress in a subscriber installation of a broadband communication system, said testing instrument comprising
    a tunable signal detector that can be tuned to a frequency of an over-the-air broadcast signal and measure signal power at said frequency of said over-the-air broadcast signal appearing in said subscriber installation,
    a global positioning system receiver, and
    a data processor that is programmed to provide a computation of a signal power level of said over-the-air broadcast signal at a location of said testing instrument determined by said global positioning system based on a location of a transmitter of known effective radiated power of said over-the-air broadcast signal for comparison with said signal power at said frequency of said over-the-air broadcast signal appearing in said subscriber installation as measured by said tunable signal detector as a said measurement of said shielding integrity of said subscriber installation against said signal ingress.

2. The testing instrument as recited in claim 1, wherein said tunable signal detector comprises a spectrum analyzer.

3. The testing instrument as recited in claim 1, wherein said tunable signal detector comprises a signal strength meter.

4. The testing instrument as recited in claim 1, wherein said data processor controls tuning of said tunable signal detector.

5. The testing instrument as recited in claim 4, wherein said tunable signal detector is tuned to a sequence of broadcast signal frequencies, each of said broadcast signal frequencies being separated from another broadcast signal frequency by a frequency interval.

6. The testing instrument as recited in claim 5, wherein said broadcast signal frequencies are FM band broadcast frequencies.

7. The testing instrument as recited in claim 1, wherein said tunable signal detector is tuned to a sequence of broadcast signal frequencies, each of said broadcast signal frequencies being separated from another broadcast signal frequency by a frequency interval.

8. The testing instrument as recited in claim 7, wherein said broadcast signal frequencies are FM band broadcast frequencies.

9. The testing instrument as recited in claim 1, further including
    wherein said GPS receiver determines said location of said testing instrument.

10. A testing instrument as recited in claim 1, wherein said data processor provides sorting of signals detected by said tunable signal detector based on signal strength received from an installation site of a broadband communication system.

11. The testing instrument as recited in claim 1, wherein said data processor computes said signal power level at said frequency of said over-the-air broadcast signal at said location of said testing instrument from said location of said transmitter and said known effective radiated power.

12. The testing instrument as recited in claim 1,
    wherein said data processor is programmed to include compensation for signal path obstruction and multi-path effects on said over-the air broadcast signal.

13. A method of making a measurement of resistance to signal ingress in an installation site of a broadband communication system, said method including steps of
    detecting and measuring a received signal level of a signal in said installation site having a frequency which corresponds to a broadcast signal frequency while said installation site is disconnected from said broadband communication system,
    determining a distance of said installation site from a broadcast transmitter of known effective radiated power at said broadcast signal frequency,
    computing an over-the-air signal level at said broadcast signal frequency based on a distance from a broadcast transmitter of known effective radiated power and said broadcast frequency, and
    comparing signal levels determined in said detecting and computing steps to determine a said measurement of resistance to signal ingress in said installation site of said broadband communication system.

14. The method as recited in claim 13, wherein said broadcast signal frequency is an FM broadcast signal frequency.

15. The method as recited in claim 13, including the further step of
    storing locations and effective radiated power of a plurality of radio frequency transmitters in a testing instrument capable of performing said detecting step.

16. The method as recited in claim 13, including a further step of matching a plurality of signals detected in said detecting step with frequencies of transmitters local to said installation site.

17. The method as recited in claim 16, including the further step of
    sorting signals detected in said detecting step by received signal strength.

18. The method as recited in claim 17, wherein an over-the-air signal strength is computed for a maximum of two transmitters in each quadrant around said installation site.

19. The method as recited in claim 13, including the further step of
    determining a location of said installation site using a GPS receiver.

20. The method as recited in claim 13, wherein said computing step is further based on said known effective radiated power of said transmitter.

21. The method as recited in claim 13, wherein said computing step includes compensation for signal path obstruction and multi-path effects on said over-the air broadcast signal.

* * * * *